(12) United States Patent
Narayanan et al.

(10) Patent No.: US 9,646,887 B1
(45) Date of Patent: May 9, 2017

(54) TAILORED SILICON LAYERS FOR TRANSISTOR MULTI-GATE CONTROL

(71) Applicant: International Business Machines Corporation, Armonk, NY (US)

(72) Inventors: Vijay Narayanan, New York, NY (US); John Rozen, Hastings on Hudson, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 15/175,574

(22) Filed: Jun. 7, 2016

Related U.S. Application Data (62) Division of application No. 14/984,471, filed on Dec. 30, 2015.

(51) Int. Cl.
| | |
|---|---|
| *H01L 29/76* | (2006.01) |
| *H01L 21/8234* | (2006.01) |
| *H01L 27/085* | (2006.01) |
| *H01L 27/088* | (2006.01) |
| *H01L 27/12* | (2006.01) |
| *H01L 29/51* | (2006.01) |
| *H01L 29/49* | (2006.01) |

(Continued)

(52) U.S. Cl.
CPC .. *H01L 21/823462* (2013.01); *H01L 21/3003* (2013.01); *H01L 21/8258* (2013.01); *H01L 21/823431* (2013.01); *H01L 21/845* (2013.01); *H01L 27/085* (2013.01); *H01L 27/0886* (2013.01); *H01L 27/1211* (2013.01); *H01L 29/20* (2013.01); *H01L 29/495* (2013.01); *H01L 29/4916* (2013.01); *H01L 29/4966* (2013.01); *H01L 29/512* (2013.01); *H01L 29/513* (2013.01)

(58) Field of Classification Search
CPC ............ H01L 29/66795; H01L 29/785; H01L 29/1025; H01L 2924/13091; H01L 29/1033; H01L 29/7851; H01L 29/7833; H01L 27/0886; H01L 27/092; H01L 27/10826; H01L 27/10879; H01L 29/66477

See application file for complete search history.

(56) References Cited

U.S. PATENT DOCUMENTS

| | | | | |
|---|---|---|---|---|
| 5,327,224 A | * | 7/1994 | Ikegami | .................. H01L 28/20 257/359 |
| 5,328,224 A | * | 7/1994 | Jacobsen | ................. A61F 2/588 294/104 |

(Continued)

OTHER PUBLICATIONS

List of IBM Patents or Patent Applications Treated as Related—Date filed: Jun. 8, 2016; 1 page.

(Continued)

*Primary Examiner* — Duy T Nguyen
(74) *Attorney, Agent, or Firm* — Cantor Colburn LLP; Vazken Alexanian (57) ABSTRACT

Disclosed is a process of making field-effect transistor gate stacks containing different deposited thin film silicon material layers having different hydrogen content, and devices comprising these gate stacks. The threshold voltage (Vt) can be tuned by tailoring the hydrogen content of the thin film silicon material layer positioned below a core dielectric and directly on a semiconductor material substrate.

19 Claims, 7 Drawing Sheets

(51) Int. Cl.
*H01L 29/20* (2006.01)
*H01L 21/84* (2006.01)
*H01L 21/8258* (2006.01)
*H01L 21/30* (2006.01)

(56) References Cited

U.S. PATENT DOCUMENTS

| | | | | |
|---|---|---|---|---|
| 7,855,105 | B1* | 12/2010 | Jagannathan | H01L 21/823431 257/E21.629 |
| 2001/0028089 | A1* | 10/2001 | Adan | H01L 29/7841 257/347 |
| 2005/0104068 | A1* | 5/2005 | Yamazaki | H01L 21/28114 257/66 |
| 2008/0099826 | A1* | 5/2008 | Lai | G11C 16/0466 257/324 |
| 2009/0179259 | A1* | 7/2009 | Wang | H01L 21/76254 257/330 |
| 2010/0327368 | A1* | 12/2010 | Kronholz | H01L 21/823857 257/369 |
| 2015/0123166 | A1* | 5/2015 | Jacob | H01L 29/785 257/192 |

OTHER PUBLICATIONS

Narayanan, Vijay, et al.; "Tailored Silicon Layers for Transistor Multi-Gate Control"; U.S. Appl. No. 14/984,471, filed Dec. 30, 2015.

* cited by examiner

TAILORED SILICON LAYERS FOR TRANSISTOR MULTI-GATE CONTROL

DOMESTIC PRIORITY

This application is a divisional of and claims priority from U.S. patent application Ser. No. 14/984,471, filed on Dec. 30, 2015, entitled "TAILORED SILICON LAYERS FOR TRANSISTOR MULTI-GATE CONTROL", the entire contents of which are incorporated herein by reference.

BACKGROUND

The present invention generally relates to field-effect transistor (FET) gate stacks containing different silicon material layers having different hydrogen content, and methods of making these gate stacks.

The metal oxide semiconductor field-effect transistor (MOSFET) is a transistor used for amplifying or switching electronic signals. The MOSFET has a source, a drain, and a metal oxide gate electrode. The metal gate is electrically insulated from the main semiconductor n-channel or p-channel by a thin layer of insulating material, for example, silicon dioxide or hafnium oxide, which makes the input resistance of the MOSFET relatively high. The gate voltage controls whether the path from drain to source is an open circuit ("off") or a resistive path ("on").

The threshold voltage (Vt) of a FET is the minimum gate-to-source voltage differential needed to create a conducting path between the source and drain. Vt control is an important feature in FET-based technology. The ability to achieve multiple Vt with a given gate stack, thereby limiting integration complexity, is an ongoing challenge in the industry. Multi-Vt devices allow the coupling of hybrid systems designed for high-performance and low power consumption. Prior methods of achieving multiple Vt involves using different dielectric capping materials or metal electrode tuning.

There remains a need in the art for solutions to achieve multiple Vt with a given gate stack, particularly with high mobility channels such, as InGaAs.

SUMMARY

In one embodiment, a method comprises forming one or more first gate stacks and one or more second gate stacks on a semiconductor material substrate, in a planar or a non-planar configuration, wherein the first gate stack has a Vt different from the second gate stack; the first gate stack comprises a first silicon material layer disposed on a first region of the semiconductor material substrate, in a planar or a non-planar configuration, a first dielectric material layer disposed on the first silicon material layer, and a first electrode material layer disposed on the dielectric material layer; and the second gate stack comprises a second silicon material layer disposed on a second region of the semiconductor material substrate, in a planar or a non-planar configuration, a second dielectric material layer disposed on the second silicon material layer, and a second electrode material layer disposed on the second dielectric material layer; wherein the hydrogen content of the first silicon material layer is different from the hydrogen content of the second silicon material layer.

In another embodiment, a method comprises forming one or more first gate stacks on a first region of a semiconductor material substrate, in a planar or a non-planar configuration, and one or more second gate stacks on a second region of the semiconductor material substrate, in a planar or a non-planar configuration; the first gate stack comprises a first silicon material layer disposed on the first region of semiconductor material substrate, in a planar or a non-planar configuration, a first dielectric material layer disposed on the first silicon material layer, and a first electrode material layer disposed on the dielectric material layer; the second gate stack comprises a second silicon material layer disposed on the second region of the semiconductor material substrate, in a planar or a non-planar configuration, a second dielectric material layer disposed on the second silicon material layer, and a second electrode material layer disposed on the second dielectric material layer; and controlling the hydrogen content of the first silicon material layer and the second silicon material layer at the time the silicon material is deposited, by a post-deposition process after the silicon material has been deposited, or a combination thereof to result in a hydrogen content of the first silicon material layer that is different from the hydrogen content of the second silicon material layer; and wherein the first gate stack has a Vt different from the second gate stack.

In yet another embodiment, a semiconductor device comprises a single base substrate, in a planar or non-planar configuration, comprising one or more first gate stacks and one or more second gate stacks; the first gate stack comprising: a first silicon material layer disposed on a first semiconductor material substrate; a first dielectric material layer disposed on the first silicon material layer; and a first electrode material layer disposed on the first dielectric layer; the second gate stack comprising: a second silicon material layer disposed on a second semiconductor material substrate; a second dielectric material layer disposed on the second silicon material layer; and a second electrode material layer disposed on the second dielectric layer; and source and drain regions adjacent to the gate stacks, wherein the hydrogen content of the first silicon material layer is different from the hydrogen content of the second silicon material layer; and wherein the first gate stack has a Vt different from the second gate stack.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

As stated above, the present invention relates to FET gate stacks containing different silicon material layers having different hydrogen content, and methods of making these gate stacks. The Vt of a given gate stack in a device can be tuned by using hydrogen content variation in a thin film silicon material layer positioned below the core dielectric and directly on a semiconductor material substrate of the gate stack. The stoichiometry and morphology of the thin film silicon material layer can be controlled during deposition, during a post-deposition process, or a combination thereof. The methods described herein allow for the tuning of the Vt by tuning the hydrogen content of thin film silicon material layers in a simple fashion to allow for the formation of multiple Vt on the same chip. This is achieved by tuning the hydrogen content of a silicon material layer most intimate with a semiconductor material layer. The instant approach is particularly applicable for use with high mobility channel materials such, as InGaAs.

The gate stacking sequence is not limited to any specific structure or morphology and can include planar and non-planar substrates, e.g. FINS, nanowires, and nanosheets. The number of gate stacks is also not limited and can include 1, 2, 3, 4, or more of the gate stacks having different silicon material layers.

In an embodiment, a semiconductor device comprises a semiconductor material substrate and a dual gate stack arranged on the semiconductor material substrate, the dual gate stack comprising a first gate stack and a second gate stack; the first gate stack comprising: a first silicon material layer arranged on a first region of the semiconductor material substrate; a first dielectric material layer disposed on the first silicon material layer; and a first electrode material layer disposed on the first dielectric layer; the second gate stack comprising: a second silicon material layer arranged on a second region of the semiconductor material substrate; a second dielectric material layer disposed on the second silicon material layer; and a second electrode material layer disposed on the second dielectric layer; and source and drain regions adjacent to the dual gate stack, wherein the hydrogen content of the first silicon material layer is different from the hydrogen content of the second silicon material layer. As used herein, the terms "first," "second," and the like, as used herein do not denote any order, quantity, or importance, but rather are used to distinguish one element from another.

The semiconductor material substrate may include, for example, a bulk silicon, a silicon germanium, germanium, a high mobility channel material such as, InGaAs, GaAs, InAs, InAlAs, a wide band gap material, such as SiC or GaN. Non-limiting examples of suitable semiconductor materials for the semiconductor material substrate include silicon (Si), germanium (Ge), silicon-germanium (SiGe), SiC, III-V compounds, or any combination thereof. The III-V compound semiconductors are obtained by combining group III elements (e.g. Al, Ga, In) with group V elements (e.g. N, P, As, Sb). Non-limiting examples of III-V compound semiconductors include GaAs, GaP, GaN, InGaAs, InAs, InAlAs, and InP. In an embodiment, the substrate is prepared by growing a semiconductor material layer on a seed layer located on the surface of a wafer. In an embodiment, the semiconductor material layer includes InGaAs.

The semiconductor material substrate can have any desired thickness, geometry, or a combination thereof, and is therefore not limited.

The silicon material layer may include, for example, amorphous silicon (aSi), hydrogenated amorphous silicon (aSi:H), polysilicon (polySi), hydrogenated polysilicon (polySi:H), nanocrystalline silicon (nc-Si), or hydrogenated nanocrystalline silicon (nc-Si:H). The silicon material layer may be formed by, for example, chemical vapor deposition (CVD) process, a plasma-enhanced chemical vapor deposition (PECVD) process, a remote plasma chemical vapor deposition (RPCVD), hot-wire chemical vapor deposition (HWCVD), an atomic layer deposition (ALD), a plasma-enhanced atomic layer deposition (ALD), a physical vapor deposition (PVD) process, a molecular beam epitaxy, e-beam deposition, any SixHy based process, or SixCly based process. Suitable precursor materials for use in preparing the silicon material layer include silanes (SixHy), chlorides (SixCly), dichlorosilane, organic silane precursors, and the like, or a combination thereof.

The silicon material layer can have a thickness of less than 50 angstroms (Å), specifically about 1 to about 50 Å, more specifically about 5 to about 40, and yet more specifically about 20 to about 30 Å.

The hydrogen content of the silicon material layer can be controlled during the growth process for making the layer or it can be controlled post-growth. During growth processes to control hydrogen content include, for example, dilution of the Si-containing gas, H radical density, temperature, growth rate, and plasma parameter control, and the like, or a combination thereof. For example, when using PECVD, both the dilution of silane in hydrogen gas and the direct plasma power can be used to tune the film properties.

Post-growth control of the hydrogen content of the silicon material layer can include, for example, hydrogen removal processes ("drive out"), "drive in" processes such as forming gas anneal (FGA), plasma treatment, implant, and the like, or a combination thereof. The amount of an hydrogen source (atomic, radical or compound) in the annealing medium can be tuned to adjust the density of hydrogen in the thin silicon material layer.

In one embodiment, two or more types of gate stacks are prepared where each type has a hydrogen content for the thin film silicon material layer which differs from the hydrogen content of the other type(s). Within this embodiment, the differing thin film silicon material layers are the result of controlling the hydrogen content through each distinct deposition process step. Mask and etch processes can be used in the process to make these gate stacks.

In another embodiment, two or more types of gate stacks are prepared where each type has a hydrogen content for the thin film silicon material layer which differs from the hydrogen content of the other type(s). Within this embodiment, a common silicon material layer can be grown at an initial step followed by a selective post-growth process to manipulate and control the hydrogen content of a portion of the silicon material layer to result in two or more types of silicon material differing by their hydrogen contents. Mask and etch processes can be used in the process along with the post-growth "drive in" or "drive out" processes described above. In a further embodiment, the post-growth processes can be conducted after the remaining dielectric material layer and optionally after the electrode material layer has been formed.

Suitable dielectric materials for the top dielectric material layer include, for example, silicon oxide (SiO), silicon nitride (SiN), silicon oxynitride (SiON), boron nitride, high-k materials, or any combination of these materials. Examples of high-k materials include but are not limited to metal oxides such as hafnium oxide (HfO), hafnium silicon oxide, hafnium silicon oxynitride, lanthanum oxide (LaO), lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide (AlO), lead scandium tantalum oxide, and lead zinc niobate, or any combination thereof. The high-k may further include dopants such as lanthanum, aluminum. The dielectric material layer may be formed, for example, using a deposition process such as atomic layer deposition (ALD), chemical vapor deposition (CVD) and epitaxial growth processes.

The electrode material layer may include, for example, a TiN, polysilicon (polySi), Ti, Al, TiAl, Au, Pd, or any combination thereof. The electrode material layer may be formed, for example, using a deposition process such as ALD, PVD, CVD, and the like.

The various embodiments are now described in detail with accompanying figures. Like reference numerals refer to like elements across different embodiments. The figures are not to scale.

Figure 1:
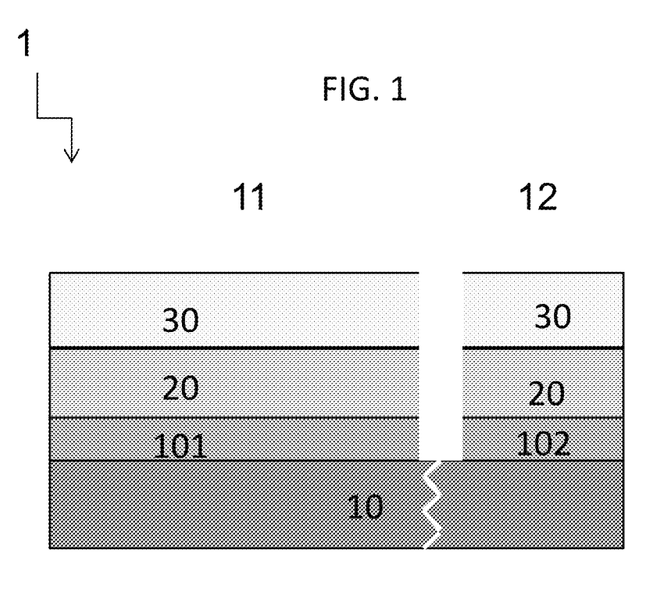
FIG. 1 illustrates a cross-section of a planar semiconductor substrate, dual gate stack, single polarity shown (sources, drains, etc. omitted).

FIG. 1 is an exemplary embodiment of a planar, dual gate stack (1); single polarity shown (i.e. only nFET or pFET) and sources, drains, etc. are omitted from the figure. In this embodiment, common material stacks are shown except for the thin film silicon material layers, e.g. aSi:H. In FIG. 1 two gate stacks are shown where one has a first threshold voltage Vt1 (11) and the other has a second threshold voltage Vt2 (12) different from Vt1. The gate stacks are located on the surface of a semiconductor material substrate (10), for example an InGaAs substrate. Directly located on the semiconductor material substrate (10) is a thin film silicon material layer (101) or (102), which are below the core dielectric material layer (20), e.g. HfO₂, and the electrode material layer (30), e.g. TiN. Silicon material layer (101) has a first hydrogen content and silicon material layer (102) has a second hydrogen content that is different than the first. The jagged lines between the gate stacks in FIGS. 1-2 and 4-6 are used to generally illustrate that the gates can be separated from one another and are not necessarily in the configuration shown.

Figure 2:
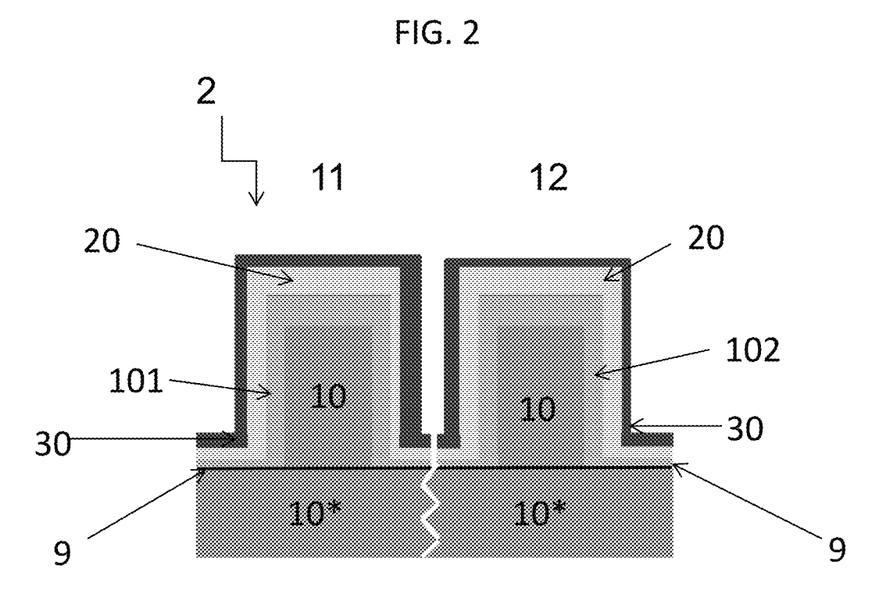
FIG. 2 illustrates a cross-section of a non-planar semiconductor substrate (e.g. FinFETs (FINS)), dual gate stack, single polarity shown (sources, drains, additional FINS, etc. omitted).

FIG. 2 is an exemplary embodiment of a three-dimensional, dual gate stack (2); single polarity shown and sources, drains, additional FINs, etc. are omitted from the figure. In FIG. 2 two gate stacks are shown where one has a first threshold voltage Vt1 (11) and the other has a second threshold voltage Vt2 (12) different from Vt1. The gate stacks are located on a 3-dimensional semiconductor channel (10), for example an InGaAs substrate. Directly located on the semiconductor material (10) is a thin film silicon material layer (101) or (102), which are below the core dielectric material layer (20) and the electrode material layer (30), e.g. TiN. Silicon material layer (101) has a first hydrogen content and silicon material layer (102) has a second hydrogen content that is different than the first. Within the embodiment of FIG. 2, the FIN channels are on a non-conducting/insulating material layer (9) which in turn is on semiconductor substrate (10*) to isolate the channels from the substrate (e.g. semiconductor on insulator ("SOI") technology). Such non-conducting material includes insulators (e.g. Si on SiO₂) or wide band-gap material (e.g. InGaAs on InAlAs), and the like. In another embodiment, the semiconductor material substrate (10*) can be the same semiconductor material as (10), for example, the gate stacks are directly on a semiconductor material substrate where (10*) is the same material as (10) and insulating material layer (9) is absent. As understood by the skilled artisan, gate stacks (11) and (12) of FIG. 2 each represents a single FIN, which may be one of a plurality of FINs present in a single three-dimensional device. The "plurality of FINs" is meant to be representative (i.e. a given Vt device of one polarity will be made of several FINs with a common gate electrode). While the figure illustrates only one FIN for each of the two Vt, it is to be understood that there may be several FINs in a given device for each of the two different Vt stacks. The same understanding applies to the remainder of the three-dimensional devices of FIGS. 4-6. Likewise, in the planar device examples of FIGS. 1 and 3, it is understood the device comprises more than two gate stacks, that is, the device may comprise a plurality of gate stacks (11) and (12).

Figure 3:
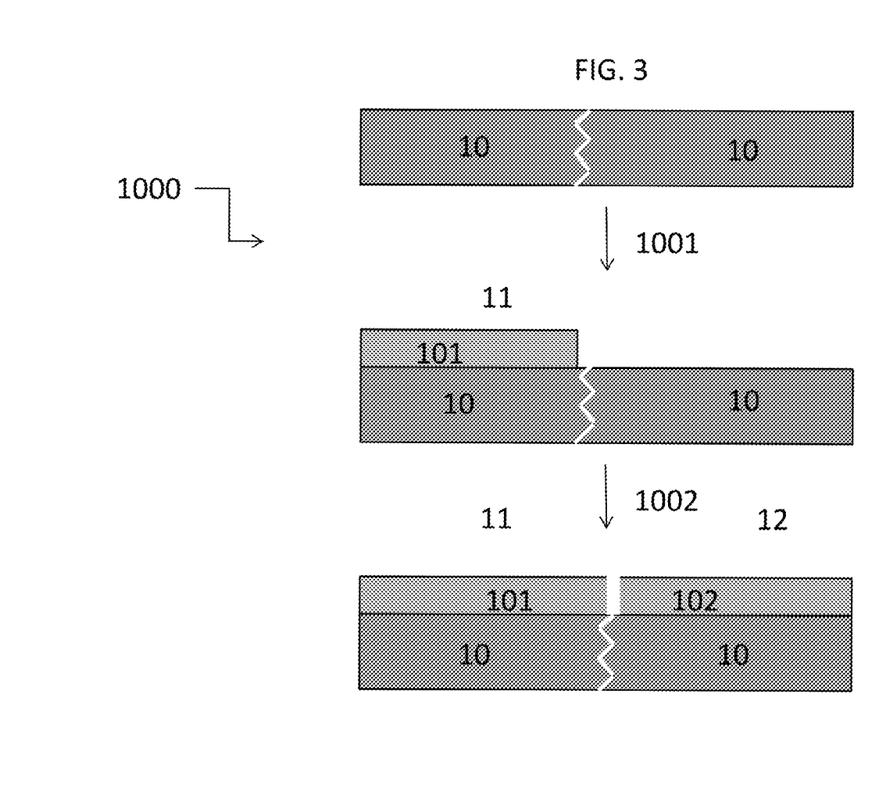
FIG. 3 illustrates a general process for a hydrogen tuning method using a deposition process for a planar device.

FIG. 3 illustrates one embodiment of a general process (1000) for a hydrogen tuning method using a deposition process for the preparation of a planar device, but the general strategy is equally applicable to the formation of a three dimensional device. In step (1001) a first thin film silicon material layer (101) is deposited on a semiconductor material substrate (10). The first thin film silicon material layer (101) is tailored to have a first hydrogen content by controlling the hydrogen content during growth of the layer. In step (1002) a second thin film silicon material layer (102) is deposited on a different region of the semiconductor material substrate (10). The second thin film silicon material layer (102) is tailored to have a second hydrogen content by controlling the hydrogen content during growth of the layer. By controlling the deposition processes the first silicon material layer (101) is formed to have a hydrogen content that is different from the hydrogen content of the second silicon material layer (102). Gates stacks, including the bulk dielectric and the metal electrode, formed from the first silicon material layer (101) will have a first threshold voltage Vt1 (11) and gates stacks formed from the second silicon material layer (102) will have a second threshold voltage Vt2 (12) different from Vt1.

In an alternative embodiment, a thin film silicon material layer can be the result of two or more depositions of material. For example, a first thin film silicon material layer can be deposited on a semiconductor material substrate, similar to FIG. 3, step (1001). However, in a subsequent step, a second thin film silicon material layer can be deposited on both the first thin film silicon material layer or sacrificial mask layer and deposited on a region of the semiconductor material substrate not covered with the first thin film silicon material layer. The thin film silicon material layer made up of the first and second silicon material layer can be referred to as a third silicon material layer having different film properties than the individual first and second starting layers. Within this embodiment, gates stacks (including a bulk dielectric and a metal electrode) will be formed from the second silicon material layer and will have a first threshold voltage Vt1 and gates stacks formed from the third silicon material layer will have a second threshold voltage Vt2 different from Vt1. Exemplary masking material includes Hard Masks (e.g. nitrides) and Soft Masks (e.g. polymer photo-resist).

Figure 4:
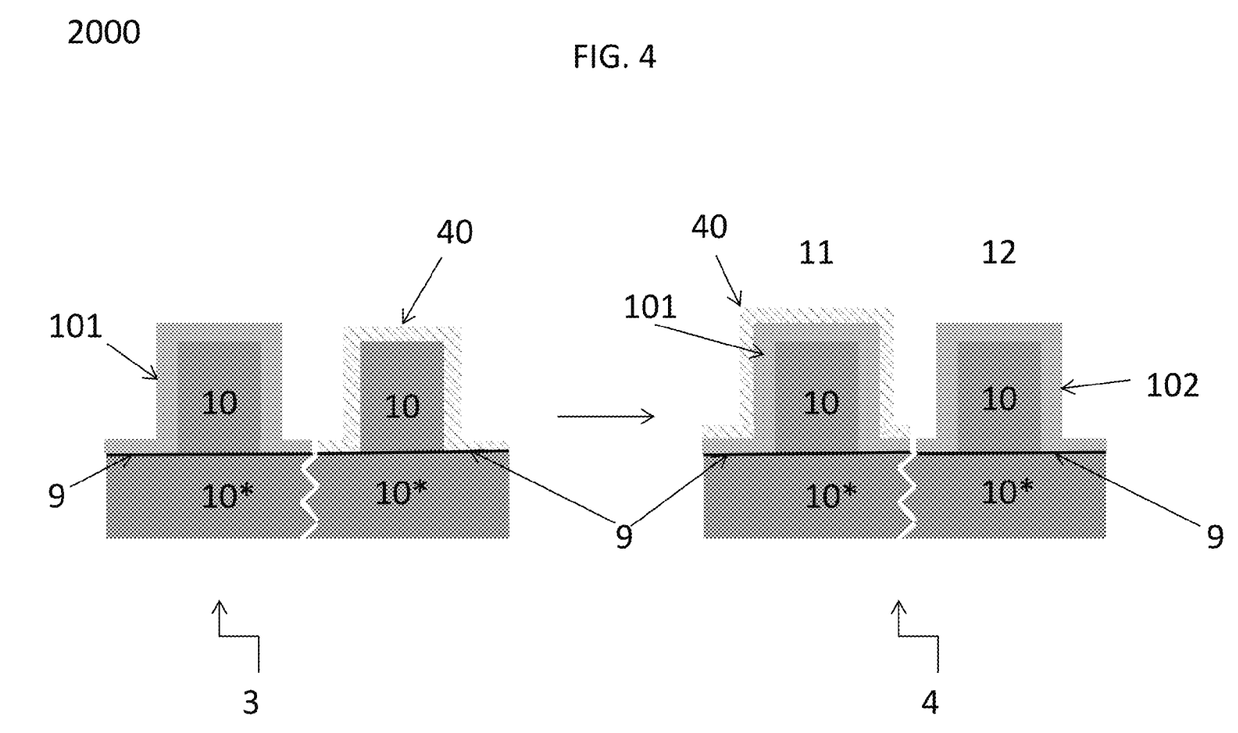
FIG. 4 illustrates an embodiment of a hydrogen tuning method using separate silicon deposition processes in the preparation of a three-dimensional device.

FIG. 4 illustrates one embodiment of a general process (2000) for a hydrogen tuning method using separate silicon deposition processes in the preparation of a three-dimensional device. Structure (3) represents the result of selectively masking a Vt2 region using an appropriate masking material (40) and mask and etch processes, and the deposition of a first thin film silicon material layer (101) on a semiconductor material substrate (10) in a Vt1 region. Structure (3) is transformed into structure (4) by selectively masking the first thin film silicon material layer (101) with a masking material (40), removing the masking material from the Vt2 region, and depositing a second thin film silicon material layer (102) on the semiconductor material substrate (10) in the Vt2 region. The first thin film silicon material layer (101) is tailored to have a first hydrogen content by controlling the hydrogen content during growth of the layer. The second thin film silicon material layer (102) is tailored to have a second hydrogen content by controlling the hydrogen content during growth of the layer. By controlling the deposition processes, the first silicon material layer (101) is formed to have a hydrogen content that is different from the hydrogen content of the second silicon material layer (102). Gates stacks formed from the first silicon material layer (101) will have a first threshold voltage Vt1 (11) and gates stacks formed from the second silicon material layer (102) will have a second threshold voltage Vt2 (12) different from Vt1. Further steps (not shown in FIG. 4) can be conducted to create the gate stacks, such as forming a dielectric material layer over the first thin film silicon material layer (101) and the second thin film silicon material layer (102), and further formation of electrode material layers over the dielectric material layers. Structures (3) and (4) further comprise semiconductor material substrate (10*) and insulating material layer (9), where (10*) and (10) are different materials. In an embodiment, semiconductor material substrate (10*) can be the same semiconductor material as (10). In another embodiment, not shown in the figure, the second thin film silicon material layer can be formed on the masking material layer (40) in the Vt1 (11) region when the second thin film silicon material layer (102) material is deposited in the Vt2 (12) region. In another embodiment, the semiconductor material substrate (10*) can be the same semiconductor material as (10), for example, the gate stacks are directly on a semiconductor material substrate where (10*) is the same material as (10) and insulating material layer (9) is absent.

Figure 5:
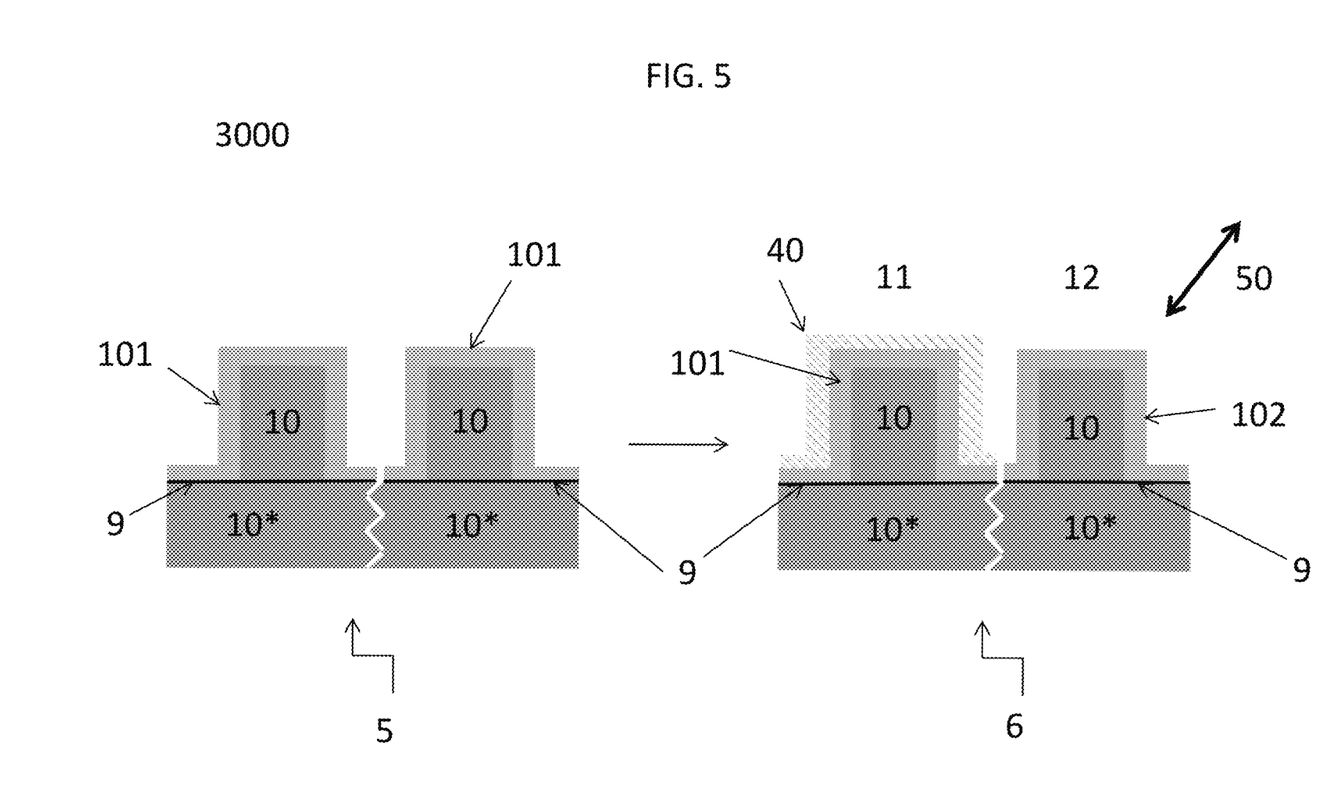
FIG. 5 illustrates an embodiment of a hydrogen tuning method using a single silicon deposition process and a selective hydrogen redistribution step in the preparation of a three-dimensional device.

FIG. 5 illustrates one embodiment of a general process (3000) for a hydrogen tuning method using a single silicon deposition process and a selective hydrogen redistribution step in the preparation of a three-dimensional device. In structure (5) a first thin film silicon material layer (101) is deposited on a semiconductor material substrate (10). Structure (5) is transformed into structure (6) by selectively masking a Vt1 region (11) using an appropriate masking material (40) and selectively converting a portion of the first thin film silicon material layer (101) into a second thin film silicon material layer (102) in a Vt2 region (12). The conversion is conducted post-deposition using a hydrogen drive in/out process (50), a gate stack hydrogen redistribution process, or a combination thereof. The first thin film silicon material layer (101) is tailored to have a first hydrogen content by controlling the hydrogen content during growth of the layer. The second thin film silicon material layer (102) is tailored to have a second hydrogen content by controlling the hydrogen content in the post-deposition step. By controlling the deposition and post-deposition processes, the first silicon material layer (101) is formed to have a hydrogen content that is different from the hydrogen content of the second silicon material layer (102). Gates stacks formed from the first silicon material layer (101) will have a first threshold voltage Vt1 (11) and gates stacks formed from the second silicon material layer (102) will have a second threshold voltage Vt2 (12) different from Vt1. Further steps (not shown in FIG. 5) can be conducted to create the gate stacks, such as forming a dielectric material layer over the first thin film silicon material layer (101) and the second thin film silicon material layer (102), and further formation of electrode material layers over the dielectric material layers. Transformation of structure (5) to structure (6) can be achieved using mask and etch processes using a suitable masking material (40). The masking material layers can have distinct etch rates for control of the process. Exemplary masking material includes Hard Masks (e.g. nitrides) and Soft Masks (e.g. polymer photo-resist). Structures (5) and (6) further comprise semiconductor material substrate (10*) and insulating material layer (9), where (10*) and (10) are different materials. In an embodiment, semiconductor material substrate (10*) can be the same semiconductor material as (10). In an embodiment, the insulating material layer (9) can be absent.

Figure 6:
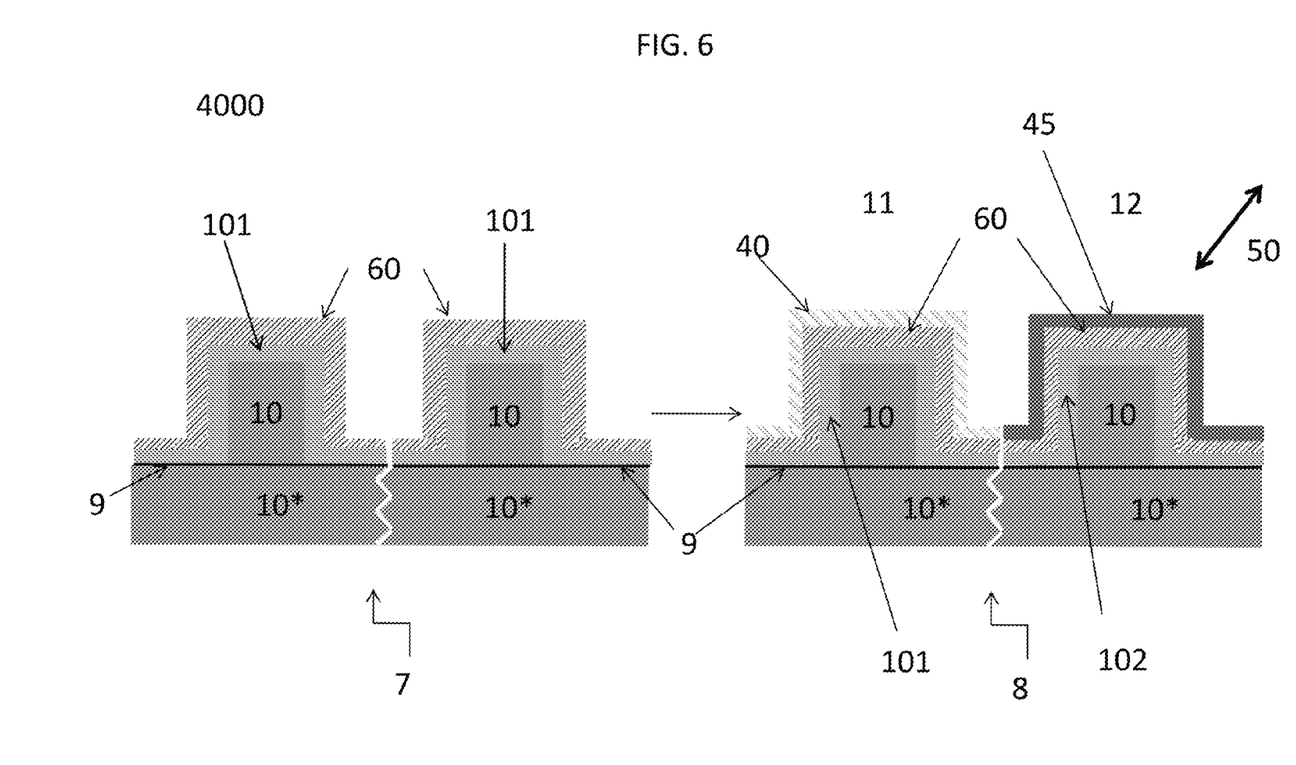
FIG. 6 illustrates an embodiment of a hydrogen tuning method using a single silicon deposition process and a selective hydrogen redistribution step conducted after the formation of a dielectric/electrode formation step in the preparation of a three-dimensional device.

FIG. 6 illustrates one embodiment of a general process (4000) for a hydrogen tuning method using a single silicon deposition process and a selective hydrogen redistribution step conducted after the formation of a dielectric/electrode formation step. Structure (7) contains a common gate stack having a first thin film silicon material layer (101) that has been deposited on a semiconductor material substrate (10) and a dielectric/metal layer (60) that has been deposited over the first thin film silicon material layer (101). Structure (7) is transformed into structure (8) by selectively masking a Vt1 region (11) using an appropriate masking material (40) and selectively converting a portion of the first thin film silicon material layer (101) into a second thin film silicon material layer (102) located in a Vt2 region (12). The conversion is conducted post-deposition using a hydrogen drive in/out process (50), a gate stack hydrogen redistribution process using a catalytic material layer (45), or a combination thereof. The first thin film silicon material layer (101) is tailored to have a first hydrogen content by controlling the hydrogen content during growth of the layer. The second thin film silicon material layer (102) is tailored to have a second hydrogen content by controlling the hydrogen content in the post-deposition processing step. By controlling the deposition and post-deposition processes the first silicon material layer (101) is formed to have a hydrogen content that is different from the hydrogen content of the second silicon material layer (102). Gates stacks formed from the first silicon material layer (101) will have a first threshold voltage Vt1 (11) and gates stacks formed from the second silicon material layer (102) will have a second threshold voltage Vt2 (12) different from Vt1. Transformation of structure (7) to structure (8) can be achieved using mask and etch processes using a suitable masking material (40) and catalytic material layer (45). The catalytic material layer can contain materials such as metals that facilitate the cracking of molecular hydrogen. Exemplary metals for the catalytic layers include, for example Platinum. Palladium, Rhodium, Ruthenium, Nickel, and the like. Structures (7) and (8) further comprise semiconductor material substrate (10*) and insulating material layer (9), where (10*) and (10) are different materials. In an embodiment, semiconductor material substrate (10*) can be the same semiconductor material as (10). One having ordinary skill in the art can apply this embodiment to a higher integration level, e.g.

front end, middle end, or back end of the line; i.e. meaning that hydrogen redistribution in the stack can be achieved during other fabrication steps. In an embodiment, the insulating material layer (9) can be absent.

Figure 7:
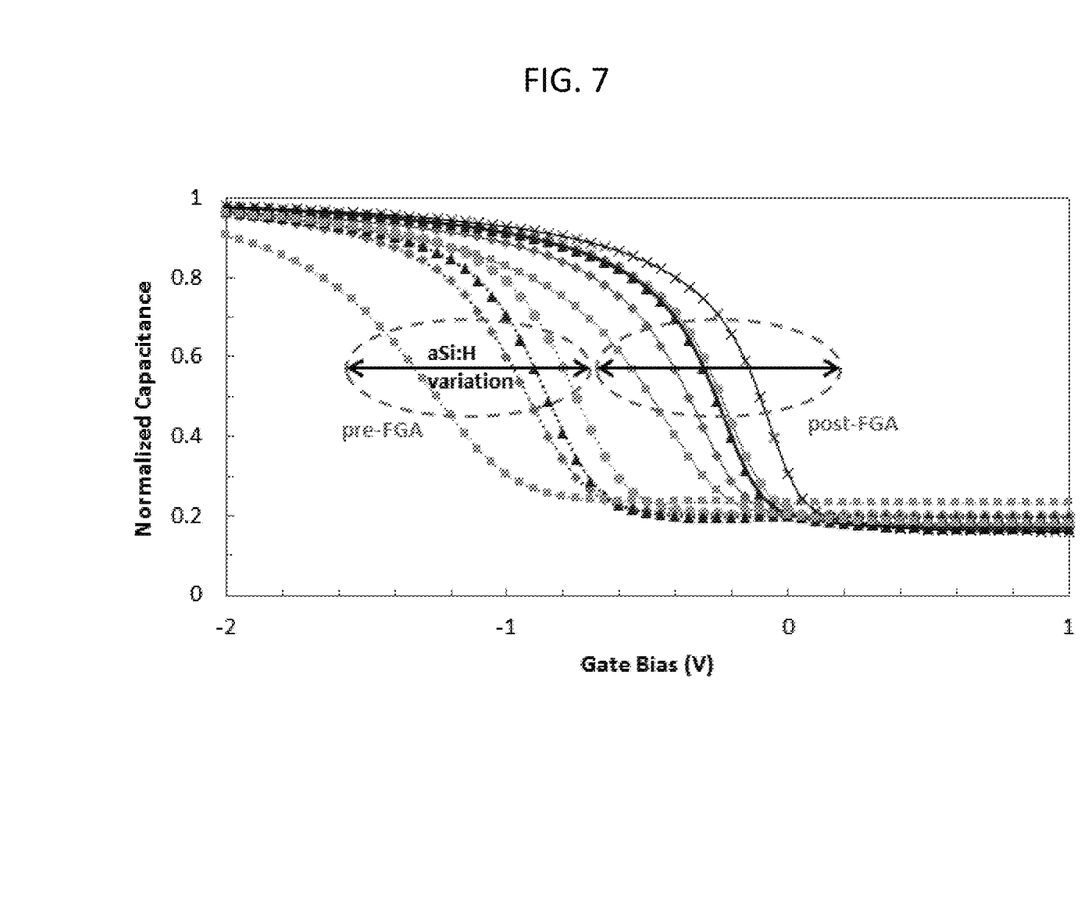
FIG. 7 illustrates a graph of gate voltage versus normalized capacitance for a number of devices containing a gate stack before a forming gas anneal ("pre-FGA") and after a forming gas anneal ("post-FGA") of a thin deposited insulating silicon material layer atop a semiconductor to show change in voltage due to a change in hydrogen content of the silicon material layer.

A number of single devices were prepared having one type of gate stack comprising a thin film silicon material layer of aSi:H and HfO as the dielectric material layer. PECVD was used to prepare the silicon material layer and control the initial hydrogen content the silicon material. Each device had a different first silicon material layer hydrogen content due to the deposition process employed. For each device, the gate voltage (Vg) in volts (V) was measured against normalized capacitance (C/Cmax) and the results are shown in FIG. 7. In addition, the hydrogen content of each silicon material layer was subsequently changed in a post-deposition process using a forming gas anneal ("Post-FGA") to achieve a second hydrogen content. FIG. 7 further contains a plot of C/Cmax versus Vg for these Post-FGA devices. As the results show, the gate voltage can be tailored by adjusting the hydrogen content of the silicon material layer.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof. The endpoints of all ranges directed to the same component or property are inclusive of the endpoints, are independently combinable, and include all intermediate points and ranges.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device, comprising:
   a single base substrate, in a planar or non-planar configuration, comprising one or more first gate stacks and one or more second gate stacks;
   the one or more first gate stack comprising:
      a first silicon material layer disposed directly on a first semiconductor material substrate;
      a first dielectric material layer disposed on the first silicon material layer; and
      a masking layer disposed on the first dielectric material layer;
   the one or more second gate stacks comprising:
      a second silicon material layer disposed directly on a second semiconductor material substrate;
      a second dielectric material layer disposed on the second silicon material layer; and
      a catalytic material layer formed on top of the second dielectric material layer, such that no catalytic material layer is formed on top of the first dielectric material layer, wherein the catalytic material layer is selected from the group consisting of rhodium, ruthenium, and nickel; and
   source and drain regions adjacent to the one or more first and second gate stacks,
   wherein the hydrogen content of the first silicon material layer is different from the hydrogen content of the second silicon material layer; and
   wherein the one or more first gate stacks have a threshold voltage (Vt) different from the one or more second gate stacks.

2. The device of claim 1, wherein the first and second semiconductor material substrates and the base substrate include silicon (Si), germanium (Ge), silicon-germanium (SiGe), SiC, III-V compounds, or any combination thereof.

3. The device of claim 1, wherein the first silicon material layer and the second silicon material layer independently include amorphous silicon (aSi), hydrogenated amorphous silicon (aSi:H), polysilicon (polySi), hydrogenated polysilicon (polySi:H), nanocrystalline silicon (nc-Si), or hydrogenated nanocrystalline silicon (nc-Si:H).

4. The device of claim 1, wherein each of the first silicon material layer and the second silicon material layer has a thickness of less than 50 Angstroms.

5. The device of claim 1, wherein the first dielectric material layer and the second dielectric material layer independently include silicon oxide (SiO), silicon nitride (SiN), silicon oxynitride (SiON), boron nitride, high-k materials, or a combination thereof.

6. The device of claim 1, wherein the first dielectric material layer and the second dielectric material layer independently include hafnium oxide (HfO), hafnium silicon oxide, hafnium silicon oxynitride, lanthanum oxide (LaO), lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide (AlO), lead scandium tantalum oxide, lead zinc niobate, or a combination thereof.

7. The device of claim 1, wherein the first and second semiconductor material substrates comprise InGaAs and the device is a n-channel device.

8. The device of claim 1, wherein the first silicon material layer and the second silicon material layer originated from different types of silicon material.

9. The device of claim 1, wherein the first silicon material layer and the second silicon material layer originated from the same type of silicon material.

10. The device of claim 1, wherein each of the first silicon material layer and the second silicon material layer has a thickness of 5 to 40 Angstroms.

11. The device of claim 1, wherein each of the first silicon material layer and the second silicon material layer has a thickness of 20 to 30 Angstroms.

12. The device of claim 1, wherein the single base substrate in the non-planar configuration comprises a first fin and a second fin.

13. The device of claim 12, wherein the first silicon material layer is disposed around the first fin.

14. The device of claim 13, wherein the second silicon material layer is disposed around the second fin.

15. The device of claim 14, wherein the first fin and the second fin extend vertically.

16. The device of claim 14, wherein the single base substrate is the same material as the first fin and the second fin.

17. The device of claim 14, wherein an interlayer is disposed between the single base substrate and the first and second fins.

18. The device of claim 17, wherein the interlayer isolates the first and second fins from the single base substrate.

19. The device of claim 18, wherein the interlayer is an insulating material.

* * * * *